(12) United States Patent
Gill (10) Patent No.: US 6,185,080 B1
(45) Date of Patent: Feb. 6, 2001

(54) DUAL TUNNEL JUNCTION SENSOR WITH A SINGLE ANTIFERROMAGNETIC LAYER

(75) Inventor: Hardayal Singh Gill, Portola Valley, CA (US)

(73) Assignee: International Business Machines Corporation, Armonk, NY (US)

( * ) Notice: Under 35 U.S.C. 154(b), the term of this patent shall be extended for 0 days.

(21) Appl. No.: 09/280,291

(22) Filed: Mar. 29, 1999

(51) Int. Cl.[7] .............................. G11B 5/30; H01C 17/02; G01R 33/02; G11C 11/00
(52) U.S. Cl. .................................. 360/324.2; 20/603.14; 324/252; 365/158
(58) Field of Search ................................ 360/324.2, 126; 324/252; 365/158; 29/603.08, 603.14

(56) References Cited

U.S. PATENT DOCUMENTS 6,108,177 * 8/2000 Gill .................................. 360/324.12

* cited by examiner

Primary Examiner—A. J. Heinz (74) Attorney, Agent, or Firm—Gray Cary Ware & Freidenrich LLP; Ervin F. Johnston (57) ABSTRACT

A dual tunnel junction sensor of a read head has two tunnel junction sensors that share a single antiferromagnetic layer. The dual tunnel junction sensor includes a first ferromagnetic electrically conductive free layer and a first ferromagnetic electrically conductive pinned layer with a barrier layer located therebetween; a second ferromagnetic electrically conductive pinned layer and a second ferromagnetic electrically conductive free layer with a second non-magnetic electrically conductive barrier layer located therebetween; and an antiferromagnetic pinning layer located between the first and second pinned layer. The antiferromagnetic pinning layer being exchange coupled to the first and second pinned layers so as to pin a magnetic moment in each of the pinned layers in a first direction. The first and second free layers each have a magnetic moment oriented in a second direction, preferably perpendicular to the first direction. Since the magnetization of the free and pinned layers are in-phase for both tunnel junctions, the resistance change due to tunneling is additive and therefore provides sensitivity enhancement of the dual tunnel junction head. Also disclosed is the use of an antiparallel (AP) pinned layer in place of the first and second pinned layers.

45 Claims, 7 Drawing Sheets

DUAL TUNNEL JUNCTION SENSOR WITH A SINGLE ANTIFERROMAGNETIC LAYER

BACKGROUND OF THE INVENTION

1. Field of the Invention

The present invention relates to a dual tunnel junction sensor with a single antiferromagnetic layer and, more particularly, to dual sensor components that share a single antiferromagnetic layer.

2. Description of the Related Art

A read head employing a read sensor may be combined with an inductive write head to form a combined magnetic head. In a magnetic disk drive, an air bearing surface (ABS) of the combined magnetic head is supported adjacent a rotating disk to write information on or read information from the disk. Information is written to the rotating disk by magnetic fields which fringe across a gap between the first and second pole pieces of the write head. In a read mode, the resistance of the read sensor changes proportionally to the magnitudes of the magnetic fields from the rotating disk. When a current is conducted through the read sensor, resistance changes cause potential changes that are detected and processed as playback signals in processing circuitry.

One type of read sensor is a tunnel junction sensor. The details of tunnel junction have been described in a commonly assigned U.S. Pat. No. 5,650,958 to Gallagher et al., which is incorporated by reference herein. A typical tunnel junction sensor has two ferromagnetic layers (i.e., the pinned and free layers) separated by a thin barrier layer which relies upon the phenomenon of spin-polarized electron tunneling. The free and pinned layers, which may be NiFe or CoFe, are separated by a non-magnetic electrically insulating barrier layer that is thin enough that quantum mechanical tunneling occurs between the free and pinned layers. The pinned layer has a magnetic moment that is pinned in its orientation by exchange coupling with a pinning layer that is made of an antiferromagnetic material. The tunneling phenomenon is electron spin dependent, making the magnetic response of the tunnel junction sensor a function of the relative orientations and spin polarization of the conduction electrons between the free and pinned layers. Ideally, the magnetic moment orientation of the pinned layer should be pinned 90° to the magnetic moment orientation of the free layer, with the magnetic direction of the free layer being able to respond to external magnetic fields. It is possible to improve the sensitivity of a tunnel junction head structure by using multiple tunnel junction sensors. One problem with this scheme is that it requires multiple antiferromagnetic layers. Since the antiferromagnetic layers are relatively thick, using multiple antiferromagnetic layers increases the size of the read gap of the tunnel junction read head which equates to a reduced linear read bit density along a track of the rotating disk. Therefore, it may not be possible to insert more than one antiferromagnetic layer within the read gap for future ultra high areal density heads. There is a strong-felt need of increasing the sensitivity of the tunnel junction head structure with multiple tunnel junction sensors without significantly increasing the size of the read gap.

SUMMARY OF THE INVENTION

The present invention is directed to a dual tunnel junction read sensor having two tunnel junction sensors that share a single antiferromagnetic layer, thereby increasing the read sensitivity of the tunnel junction read head. In addition, by making the thickness of the ferromagnetic layers in the dual tunnel junction sensor about one half the thickness of ferromagnetic layers used in a single tunnel junction sensor, the dual tunnel junction sensor will not significantly increase the read gap of the tunnel junction read head. The dual tunnel junction sensor includes a first free layer and a first pinned layer separated by a first barrier layer, a second free layer and a second pinned layer separated by a second barrier layer; and an antiferromagnetic(AFM) pinning layer between the first and second pinned layers. The first and second pinned layers are adjacent to the AFM layer and their magnetic moments are pinned by exchange coupling in a first direction, typically normal to the air bearing surface (ABS). For the dual tunnel junction head to work efficiently, the orientation of the magnetic moment of the first and second free layers should be perpendicular to the orientation of the magnetic moment of the pinned layers.

Another embodiment of the present invention is an antiparallel (AP) dual tunnel junction sensor. This AP dual tunnel junction sensor is similar to the dual tunnel junction sensor described above but utilizes first and second AP pinned layers in place of the first and second pinned layers. Each AP pinned layer has a spacer made of ruthenium (Ru) between pinned film layers, preferably made of cobalt (Co). Because of the antiparallel features of the AP layers due to the Ru spacer layer, the magnetic moment of the one pinned film is antiparallel to magnetic moment of the other pinned film, which increases the effect of the sensor when the magnetic moment of the free layers rotate. In other embodiments, a combinations of pinned and AP pinned layers may be used.

A tunneling current $I_T$ flows through the dual tunnel junction head, perpendicular to the plane of the films or layers. The amount of current $I_T$ that flows through is dependent on the relative magnetic moment directions of the pinned and free layers and magnetic moments. Since the magnetic moments of the free and pinned layers are in-phase for both tunnel junctions, the resistance change due to tunneling is additive and, therefore, provides sensitivity enhancement. As the tunnel junction sensor is positioned over a rotating magnetic disk, external magnetic fields sensed from the rotating disk moves the direction of magnetic moments of the first and second free layers up or down, changing the resistance through the tunnel junction sensor. As the direction of the magnetic moments of the first and second free layers rotate up from the ABS (i.e., going toward the opposite direction of a downwardly directed magnetic moments of the first and second pinned layer), the amount of electron tunneling decreases (i.e., the resistance increases). As the direction of the magnetic moments of the first and second free layers rotate down toward the ABS (i.e., going toward the same direction as the magnetic moments of the first and second pinned layers) the amount of electron tunneling increases (i.e., the resistance decreases). As the tunnel current $I_T$ is conducted through the sensor, the increase and decrease of electron tunneling (i.e., increase and decrease in resistance) are manifested as potential changes. These potential changes are then processed as readback signals by the processing circuitry of the disk drive. Optionally, the directions of the magnetic moments of the free and pinned layers may be opposite to that described hereinabove.

Other objects and advantages of the present invention will become apparent upon reading the following description taken together with the accompanying drawings.

DESCRIPTION OF THE PREFERRED EMBODIMENTS

Magnetic Disk Drive

Figure 1:
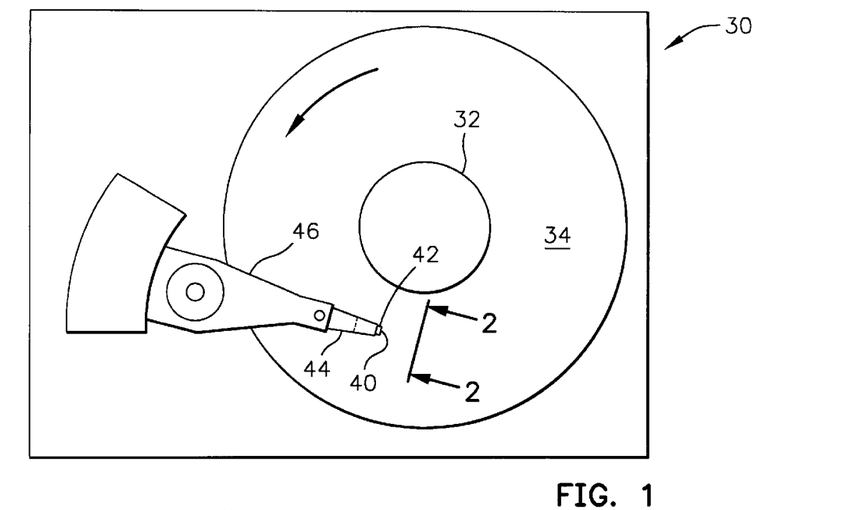
FIG. 1 is a plan view of an exemplary magnetic disk drive.
Figure 2:
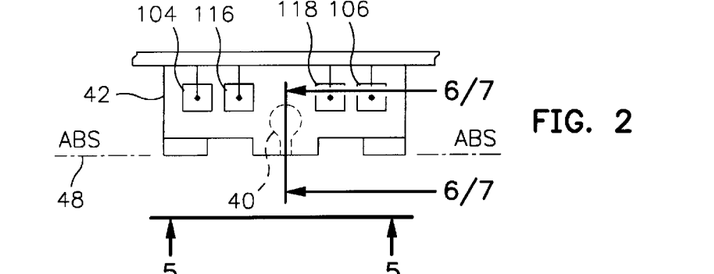
FIG. 2 is an end view of a slider with a magnetic head as seen in plane 2—2 of FIG. 1.
Figure 3:
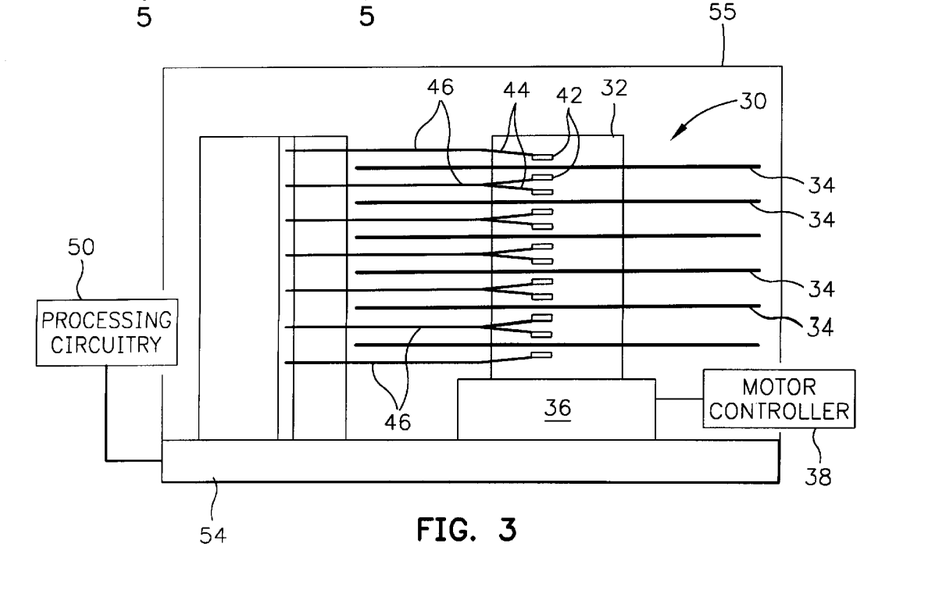
FIG. 3 is an elevation view of the magnetic disk drive wherein multiple disks and magnetic heads are employed.
Figure 4:
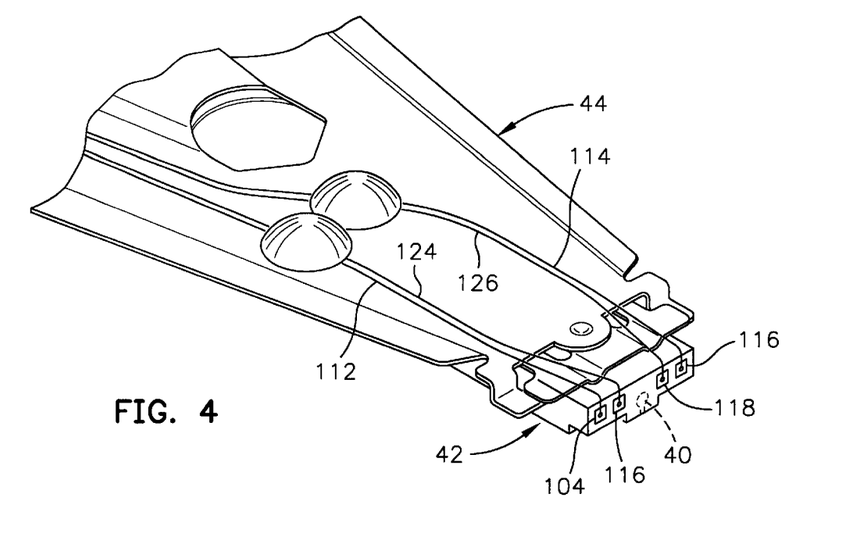
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a motor 36 that is controlled by a motor controller 38. A combined read and write magnetic head 40 is mounted on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various circular tracks on the disk. FIG. 4 shows the mounting of the slider 42 to the suspension 44, which will be described hereinafter. The components described hereinabove may be mounted on a frame 54 of a housing 55, as shown in FIG. 3.

Figure 5:
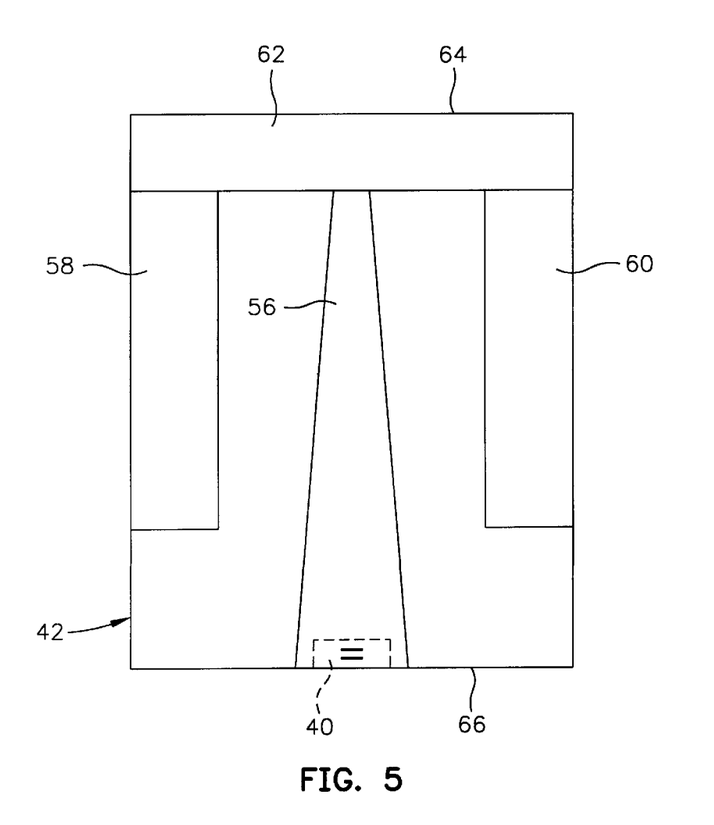
FIG. 5 is an ABS view of the slider taken along in plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 6:
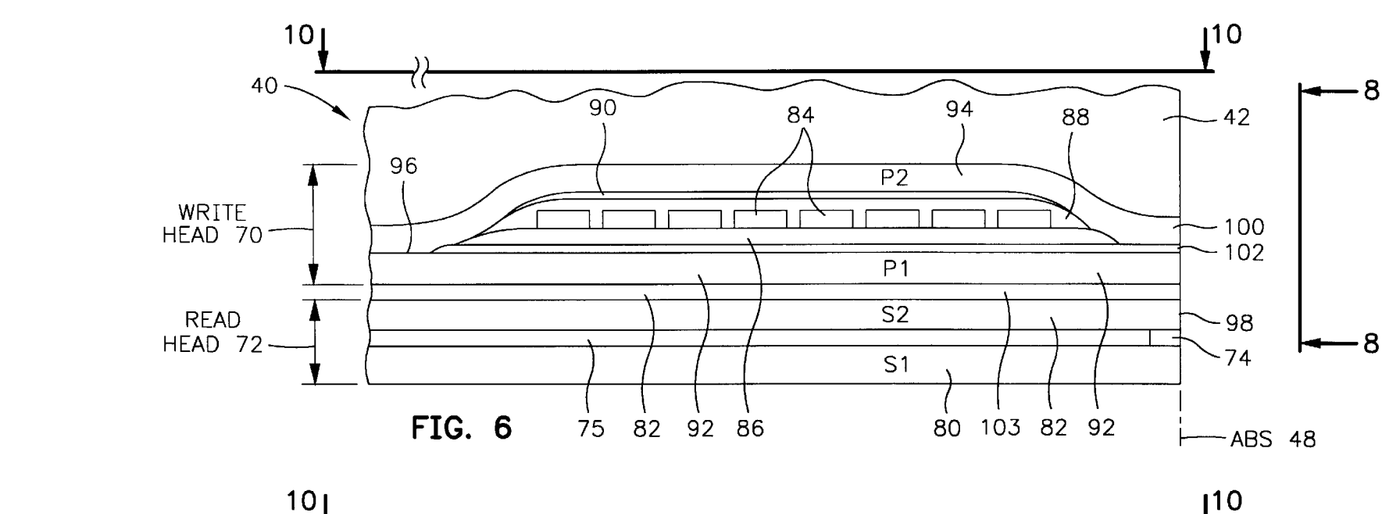
FIG. 6 is a partial view of the slider and a piggyback magnetic head as seen in plane 6—6 of FIG. 2.
Figure 8:
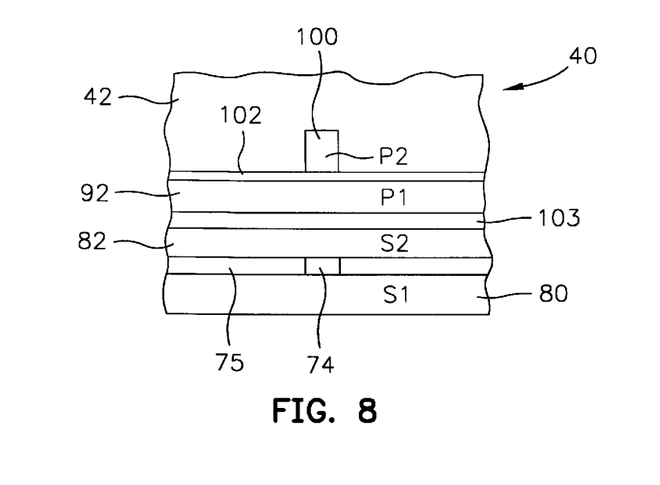
FIG. 8 is a partial ABS view of the slider taken along plane 8—8 of FIG. 6 to show the read and write elements of the piggyback magnetic head.

FIG. 6 is a side cross-sectional elevation view of a piggyback magnetic head 40, which includes a write head portion 70 and a read head portion 72, the read head portion employing an pinned spin valve sensor 74 of the present invention. FIG. 8 is an ABS view of FIG. 6. The spin valve sensor 74 and insulating gap payer 75 are sandwiched between first and second shield layers 80 and 82. The insulating gap layer 75 insulates the shields from each other and may be made from aluminum oxide, aluminum nitride or silicone dioxide. In response to external magnetic fields, the resistance of the spin valve sensor 74 changes. To determine the resistance, a tunneling sense current $I_T$ is used. The first and second shield layers 80 and 82 are employed as leads. As the magnetic moment of the free layer rotates in response to the magnetic field from the disk, the resistance of the tunnel junction structure changes, altering the current through the structure. These resistance changes to be manifested as potential changes. These potential changes are then processed as readback signals by the processing circuitry 50 shown in FIG. 3.

Figure 10:
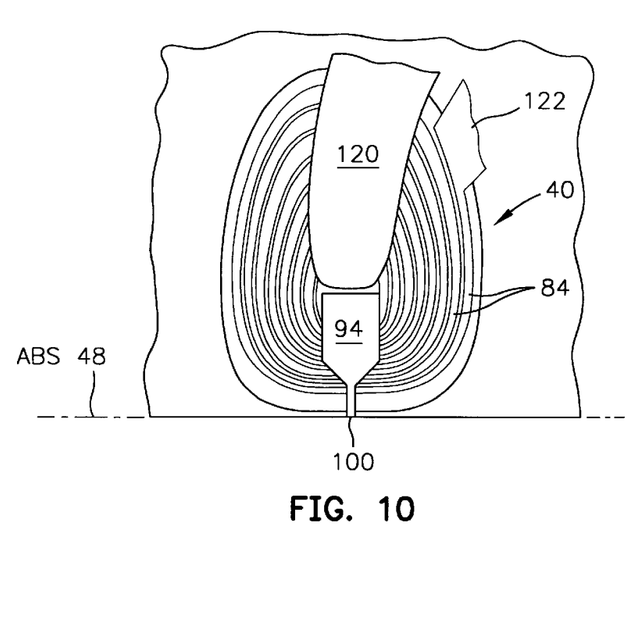
FIG. 10 is a view taken along plane 10—10 of FIGS. 6 or 7 with all material above the coil layer and leads removed.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. An insulation layer 103 is located between the second shield layer 82 and the first pole piece layer 92. Since the second shield layer 82 and the first pole piece layer 92 are separate layers this head is known as a piggyback head. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 10) to leads 124 and 126 on the suspension.

Figure 7:
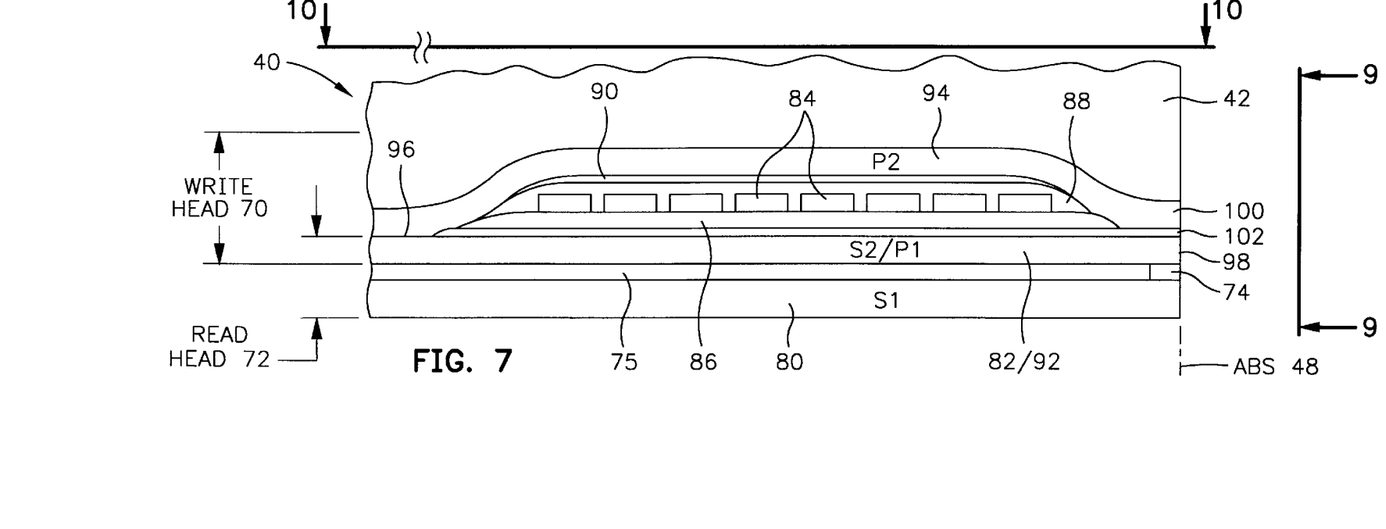
FIG. 7 is a partial view of the slider and a merged magnetic head as seen in plane 7—7 of FIG. 2.
Figure 9:
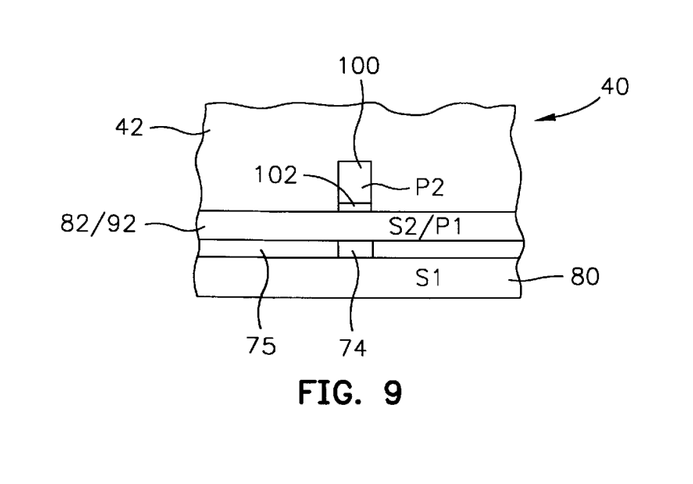
FIG. 9 is a partial ABS view of the slider taken along plane 9—9 of FIG. 7 to show the read and write elements of the merged magnetic head.

FIGS. 7 and 9 are the same as FIGS. 6 and 8 except the second shield layer 82 and the first pole piece layer 92 are a common layer. This type of head is known as the merged magnetic head. The insulation layer 103 of the piggyback head in FIGS. 6 and 8 is omitted in the merged head.

Present Invention

The present invention is directed toward a dual tunnel junction structure that uses a single centrally located antiferromagnetic (AFM) pinning layer. The dual tunnel junction structure has two tunnel junction sensors, one on each side of the central AFM pinning layer. The AFM pinning layer provides pinning by exchange coupling the magnetic moment of the ferromagnetic pinned layers positioned adjacent (i.e., above and below) to the AFM layer. The ferromagnetic free layers of each tunnel junction are separated from the pinned layers by barrier layers. The magnetic direction of the free layers are typically perpendicular to the pinned layers. Since the magnetization of the pinned and free layers are in-phase for both tunnel junctions, the resistance change due to tunneling is additive, and therefore provides sensitivity enhancement. In addition, by decreasing the thickness of the ferromagnetic layers (pinned and free) by one half the thickness of a single tunnel junction design, the dual tunnel junction sensor will be approximately the same thickness as the single tunnel junction but with improved sensitivity.

Figure 11:
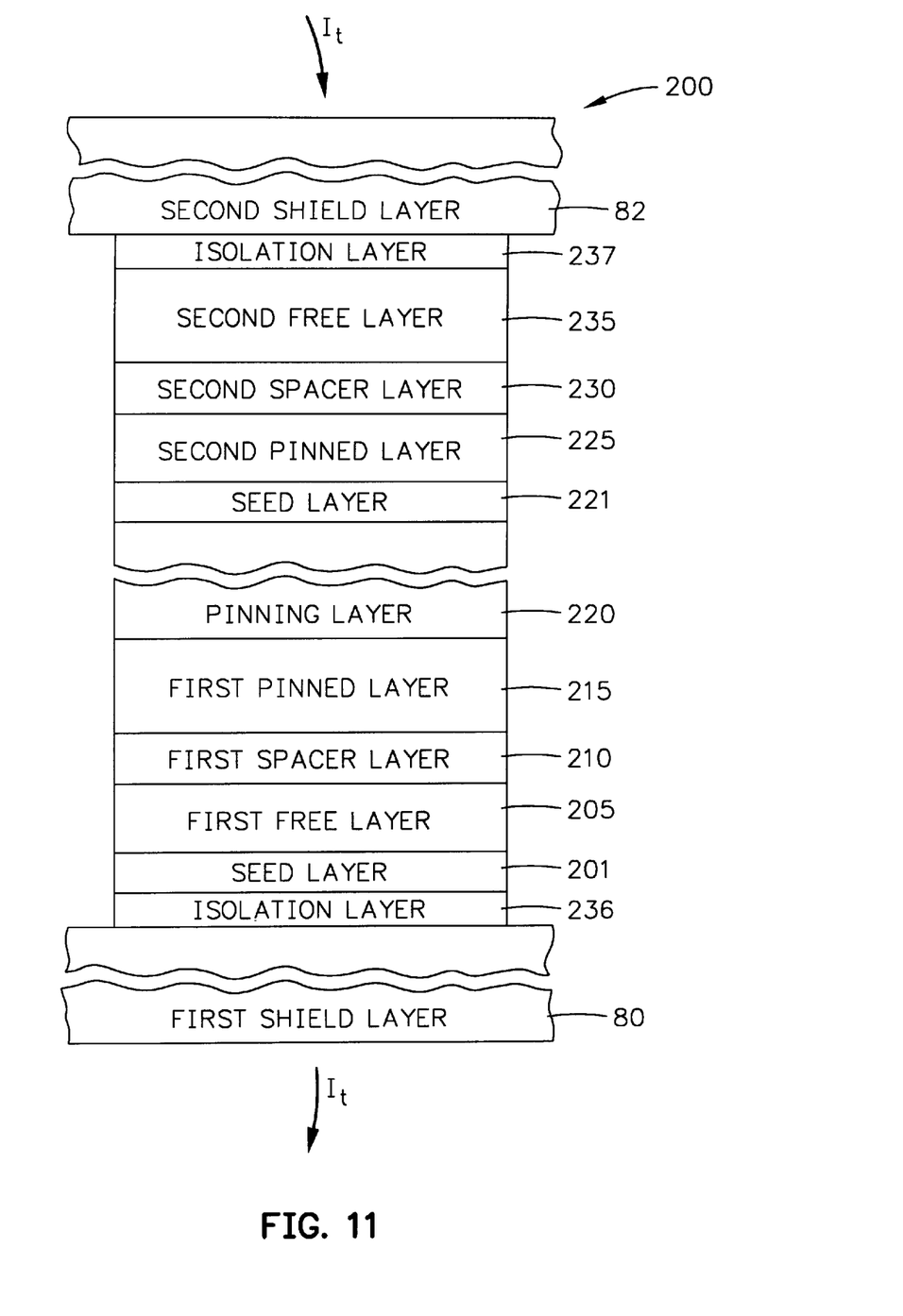
FIG. 11 is a partial air bearing surface (ABS) illustration of one embodiment of the sensor of the present invention.
Figure 12:
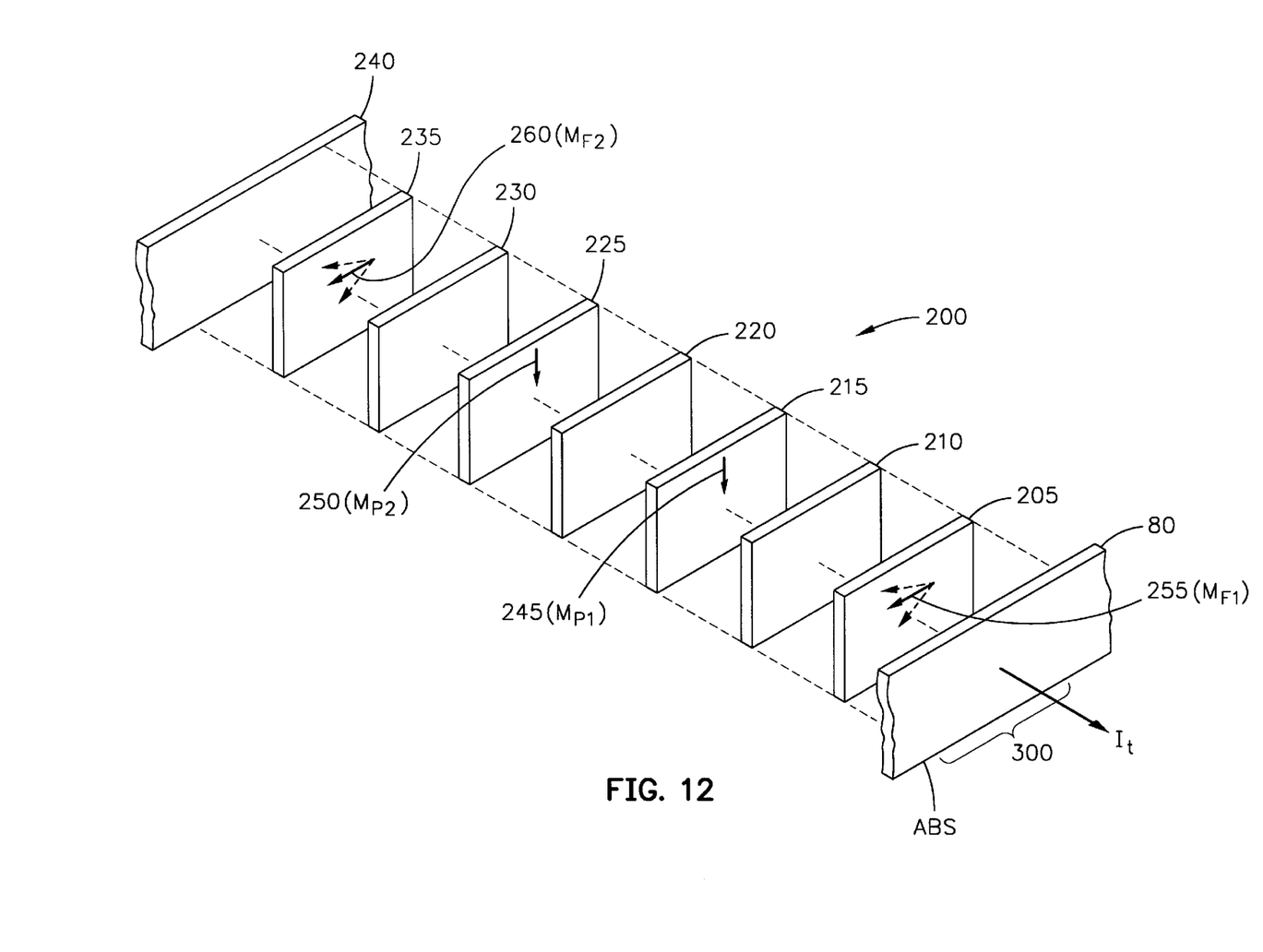
FIG. 12 is an exploded view of FIG. 11.

FIG. 11 shows one embodiment of the dual tunnel junction sensor 200 which includes a first shield layer 80, a first free layer 205, a first barrier layer 210, a first pinned layer 215, a central pinning layer 220, a second pinned layer 225, a second barrier layer 230, a second free layer 235 and a second shield layer 82. FIG. 12 is an exploded view of FIG. 11 showing the layers and exemplary desired orientations of the magnetic moments of the free and pinned layers. The magnetic moments of the pinned layers 215 and 225 are pinned by interfacial exchange coupling with the pinning layer 220. The magnetic moment ($M_{P1}$) 245 of the first pinned layer 215 and the magnetic moment ($M_{P2}$) 250 of the second pinned layer 225 are pinned parallel in a first direction, preferably perpendicular to the ABS. It is important that the pinning layer material provides strong pinning to the pinned layers. If required, one or more seed layers 201 and/or 221 may be used to assure proper pinning strength. The magnetic moment ($M_{F1}$) 255 of the first free layer 205 and the magnetic moment ($M_{F2}$) 260 of the second free layer 235 are biased parallel in a second direction. To keep the first free layer 205 and second free layer 235 magnetically isolated from the first shield 80 and second shield 82, isolation layers are positioned between them, shown in the figures as first isolation layer 236 and second isolation layer 237. The isolation layers are made of an electrically conductive, magnetically isolating material such as tantalum, gold or copper. It is generally desirable for optimum performance that the orientation of the magnetic moments 255 and 260 of the free layers are perpendicular to the magnetic moments 245 and 250 of the pinned layers (i.e., the moment direction 255 and 260 are parallel to the ABS).

In use, a tunneling current $I_T$, using spin dependent electron tunneling, flows through the tunnel junction sensor 200, using the first and second shield layers, 80 and 82, used as leads. The amount of current $I_T$ that flows through is dependent on the relative magnetic moment directions between the first 215 and second 225 pinned layers and the first 205 and second 240 free layers. As the tunnel junction sensor 200 is positioned over the magnetic disk 34, the external magnetic fields sensed from the rotating disk 34 moves the direction of magnetic moment 255 of the first free layer 205 and the magnetic moment 260 of the second free layer 240 up or down, changing the resistance through the dual tunnel junction sensor 200. Since the magnetizations of the first 205 and second 235 free layers are in-phase and the magnetizations of the first 215 and second 225 pinned layers are in-phase, the change in resistance (ΔR/R) due to the tunneling is additive, and therefore provides sensitivity enhancement. As the magnetic moments 255 and 260 of the first 205 and second 235 free layers rotate up from the ABS (i.e., going toward the opposite direction of the magnetic moments 245 and 250 of the first and second pinned layers, 215 and 225), the amount of electron tunneling decreases (i.e., the resistance increases). As the magnetic moments 255 and 260 of the first 205 and second 235 free layers rotate down toward the ABS (i.e., going toward the same direction as the magnetic moments 245 and 250 of the first and second pinned layers, 215 and 225), the amount of electron tunneling increases (i.e., the resistance decreases). As the tunnel current $I_T$ is conducted through the dual tunnel junction sensor 200, the increase and decrease of electron tunneling (i.e., increase and decrease in resistance) are manifested as potential changes. These potential changes are then processed as readback signals by the processing circuitry shown in FIG. 3.

The first and second shields 80 and 82 are made from a conductive material, such as Permalloy which is $Ni_{80}Fe_{20}$. The pinning layer 220 may be made of a conductive antiferromagnetic material such as iron manganese (FeMn), having a thickness range of 50–250 Å, preferably 100 Å. Other conductive antiferromagnetic (AFM) materials such as nickel manganese (NiMn), platinum manganese (PtMn), iridium manganese (IrMn), chromium aluminum manganese (CrAlMn) or palladium manganese (PdMn) may be used. The first and second pinned layers 215 and 225 may be made from a ferromagnetic material such as cobalt iron ($Co_{90}Fe_{10}$) with a thickness of 10–30 Å, preferably 20 Å. Optionally, the pinned layers may be made from nickel iron (NiFe) or Cobalt (Co). The pinned layers 215 and 225 are exchange coupled to the pinning layer 220 such that the orientation of the magnetic moments 245 and 250 are in the same direction as the magnetic spins of the pinning layer 220. The first 210 and second 230 barrier layers may be made of aluminum oxide, with a thickness of 10–30 Å, preferably 20 Å. The first 205 and second 235 free layers are made from ferromagnetic material such as nickel iron (NiFe) with a thickness of 10–30 Å, preferably 20 Å. The first and second shields 80 and 82 may be used as leads for the dual tunnel junction sensor 200. The inductive write head 70 is then formed on the tunnel junction read sensor 200 (or read head 72, see FIG. 6). While the above description the construction of one embodiment of the present invention, there are other layers that may be added to improve the dual tunnel junction sensor 200.

Seed layers or interface layers may be used in the dual tunnel junction sensor 200 to assure proper attachment of the layers and also control grain size, texture and crystal structure. For example, in FIG. 9, a first seed layer 201 is shown between the first shield layer 80 and the first free layer 205 and a second seed layer 221 is shown between the pinning layer 220 and the second pinned layer 225. The seed layers are typically made of nickel iron (NiFe) or cobalt iron (CoFe) with a thickness of 10–20 Å.

Figure 13:
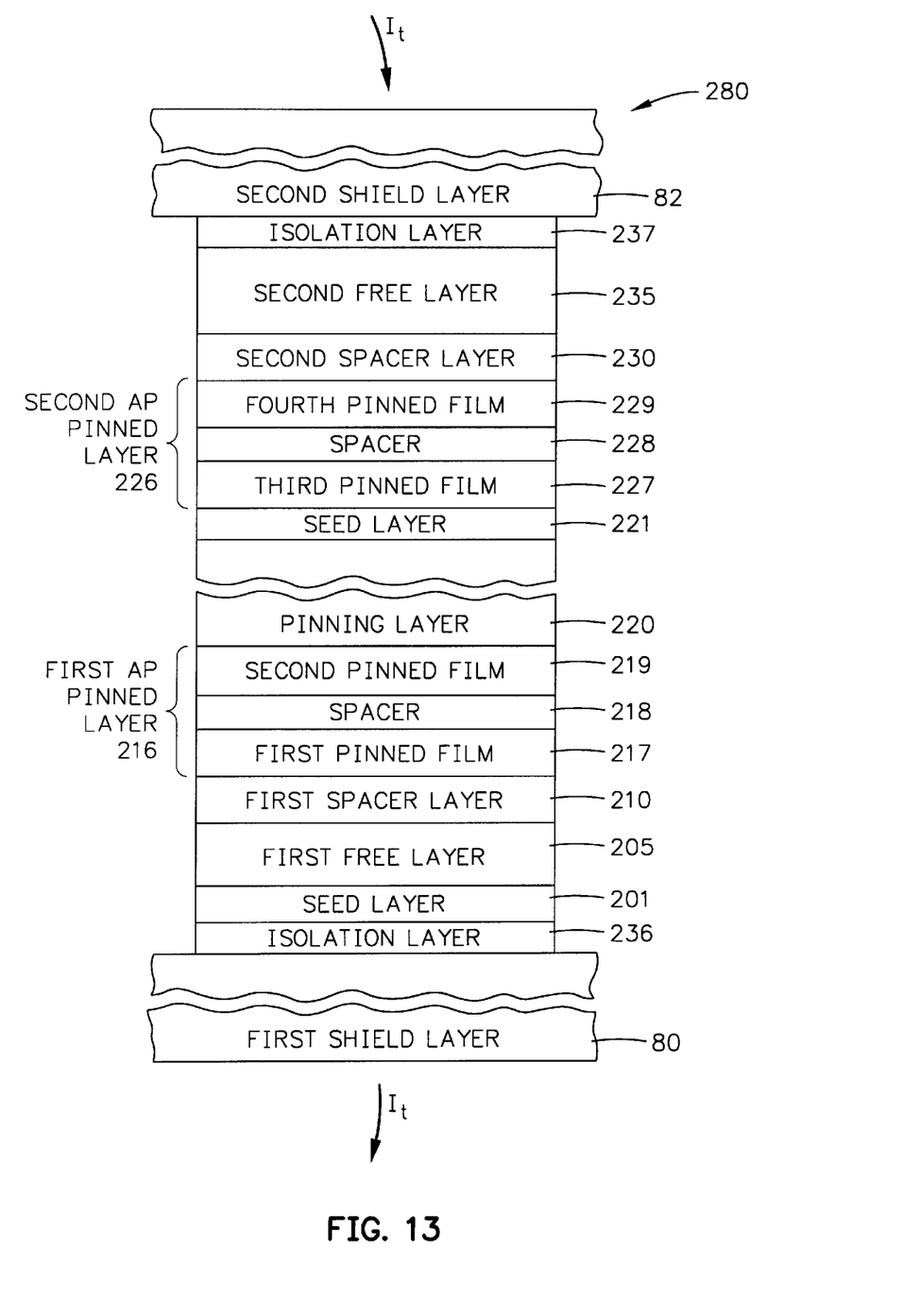
FIG. 13 is a partial ABS illustration of another embodiment of the sensor of the present invention.

FIG. 13 is another embodiment of the present invention showing an antiparallel (AP) dual tunnel junction sensor 280. This dual tunnel junction sensor 280 is similar to the double tunnel junction sensor 200 described above but utilizes first 216 and second 226 AP pinned layers in place of the first 215 and second 225 pinned layers. The first AP pinned layer 216 includes a spacer 218, made of ruthenium (Ru), with an exemplary thickness of 8 Å, located between a first pinned film 217 and a second pinned film 219, preferably made of cobalt (Co), with an exemplary thickness of 10–20 Å. The second AP pinned layer 226 includes a spacer 228, made of ruthenium (Ru), with an exemplary thickness of 8 Å, located between a third pinned film 227 and a fourth pinned film 229, preferably made of cobalt (Co), with an exemplary thickness of 10–20 Å. Optionally, the pinned film layers may be made of nickel iron (NiFe). The magnetic moment of the second pinned film 219 is in the same direction as the magnetic spins of the adjacent pinning layer 220 by interfacial exchange, with the preferred embodiment in a downward direction perpendicular to the ABS. Because of the antiparallel features of the first AP pinned layer 216 due to the Ru spacer layer 218, the magnetic moment of the first pinned film 217 is in an antiparallel direction to the magnetic moment direction of the second pinned film 219. Similarly, the direction of the magnetic moment of the third pinned film 227 is pinned by interfacial exchange with the adjacent pinning layer 220. Because of the antiparallel features of the second AP pinned layer 226 due to the spacer layer 228, the magnetic moment of the fourth pinned film 229 is antiparallel to magnetic moment of the third pinned film 227. Having the magnetic moments of the first 217 and fourth 229 pinned film layers antiparallel to the magnetic moments of the second 219 and third 227 pinned film layers increases effect of the sensor when the magnetic moment of the first 205 and second 235 free layers rotate up or down. In another embodiment, a combination of a pinned layer (215 or 225) and an AP pinned layer (216 or 226) is used. In this embodiment, the first pinned layer 215 is used with the second AP pinned layer 226 or the second pinned layer 225 is used with the first AP pinned layer 216.

Clearly, other embodiments and modifications of this invention will occur readily to those of ordinary skill in the art in view of these teachings. While the description of the tunnel junction sensor is described in relation to a magnetic disk drive read/write head, it should understood that in other applications, the tunnel junction sensor may be used alone or in combination with other devices. Therefore, the disclosed invention is to be considered merely illustrative and limited in scope only as specified in the appended claims.

What is claimed is:

1. A dual tunnel junction read head, which has an air bearing surface (ABS), comprising:
    a dual tunnel junction sensor that includes:
        a ferromagnetic electrically conductive first free layer;
        a ferromagnetic electrically conductive first pinned layer;
        a non-magnetic electrically insulating first barrier layer located between the first free layer and the first pinned layer;
        a ferromagnetic electrically conductive second pinned layer;
        an antiferromagnetic electrically conductive pinning layer located between the first and second pinned layers and exchange coupled to the pinned layers so as to pin the pinned layer magnetic moment in each of the pinned layers in a first direction;
        a ferromagnetic electrically conductive second free layer;
        a non-magnetic electrically insulating second barrier layer located between the second free layer and the second pinned layer; and
        the first and second free layers each having a magnetic moment in a second direction.

2. The dual tunnel junction read head as claimed in claim 1 further including:
    ferromagnetic first and second shield layers;
    the dual tunnel junction sensor being located between the first and second shield layers; and
    electrically conductive and magnetically isolating first and second isolation layers, the first isolation layer being located between the first shield layer and the dual tunnel junction sensor, and the second isolation layer being located between the second shield layer and the dual tunnel junction sensor.

3. The dual tunnel junction read head as claimed in claim 2 wherein the first and second shields are used as electrical leads.

4. The dual tunnel junction read head as claimed in claim 1 wherein the antiferromagnetic pinning layer is selected from the group MnFe, NiMn, IrMn, PtMn, CrAlMn and PdMn.

5. The dual tunnel junction read head as claimed in claim 1 wherein the pinned and free layers are selected from the group CoFe, NiFe and Co.

6. The dual tunnel junction read head as claimed in claim 1 wherein the first and second barrier layers are made from aluminum oxide.

7. The dual tunnel junction read head as claimed in claim 1 wherein the first direction is normal to the ABS.

8. The dual tunnel junction read head as claimed in claim 1 wherein each ferromagnetic pinned layer is an antiparallel (AP) pinned layer that includes:
    a ruthenium (Ru) film spacer layer and first and second ferromagnetic pinned films; and
    the ruthenium film spacer layer being located between the first and second pinned films so that the second pinned film is antiparallel exchange coupled to the first pinned film.

9. The dual tunnel junction read head as claimed in claim 8 wherein the first and second pinned film layers are made from cobalt (Co).

10. A dual tunnel junction magnetic head, which has an air bearing surface (ABS) comprising:
    a dual tunnel junction read head that includes:
        a dual tunnel junction sensor responsive to applied magnetic fields;
        first and second electrically conductive lead layers connected to the tunnel junction sensor for conducting a tunnel current through the tunnel junction sensor; the dual tunnel junction sensor including:
            a ferromagnetic electrically conductive first shield layer;
            a ferromagnetic electrically conductive first free layer;
            an electrically conductive and magnetically isolating first isolation layer being located between the first shield layer and the first free layer;
            a ferromagnetic electrically conductive first pinned layer;
            a non-magnetic electrically insulating first barrier layer located between the first free layer and the first pinned layer;
            a ferromagnetic electrically conductive second pinned layer;
            an antiferromagnetic electrically conductive pinning layer located between the first and second pinned layers and exchange coupled to the pinned layers so as to pin the pinned layer magnetic moment in each of the pinned layers in a first direction;
            a ferromagnetic electrically conductive second free layer, the first and second free layers each having a magnetic moment in a second direction;
            a non-magnetic electrically insulating second barrier layer located between the second free layer and the second pinned layer;
            a ferromagnetic electrically conductive second shield layer; and
            an electrically conductive and magnetically isolating second isolation layer being located between the second free layer and the second shield layer;
    write head including:
        first and second pole piece layers and a write gap layer;
        the first and second pole piece layers being separated by the write gap layer at the ABS and connected at a back gap that is recessed rearwardly in the head from the ABS;
        an insulation stack having at least first and second insulation layers;

at least one coil layer embedded in the insulation stack; and the insulation stack and the at least one coil layer being located between the first and second pole piece layers.

11. The dual tunnel junction magnetic head as claimed in claim 10 wherein the first and second electrically conductive lead layers are the electrically conductive first and second shield layers.

12. The dual tunnel junction magnetic head as claimed in claim 10 wherein the antiferromagnetic pinning layer is selected from the group MnFe, NiMn, IrMn, PtMn, CrAlMn and PdMn.

13. The dual tunnel junction magnetic head as claimed in claim 10 wherein the pinned and free layers are selected from the group CoFe, NiFe and Co.

14. The dual tunnel junction magnetic head as claimed in claim 10 wherein the first and second barrier layers are made from aluminum oxide.

15. The dual tunnel junction magnetic head as claimed in claim 10 wherein each ferromagnetic pinned layer is an antiparallel (AP) pinned layer that includes:

a ruthenium (Ru) film spacer layer and first and second ferromagnetic pinned films; and the ruthenium film spacer layer being located between the first and second pinned films so that the second pinned film is antiparallel exchange coupled to the pinned film.

16. The dual tunnel junction magnetic head as claimed in claim 15 wherein the first and second pinned film layers are made from cobalt (Co).

17. The dual tunnel junction magnetic head as claimed in claim 10 wherein the first direction is normal to the ABS.

18. A magnetic disk drive that includes at least one dual tunnel junction magnetic head, which has an air bearing surface (ABS), the disk drive comprising:

a dual tunnel junction read head that includes:
  a dual tunnel junction sensor that has a track width responsive to applied magnetic fields;
  first and second electrically conductive lead layers connected to the tunnel junction sensor for conducting a tunnel current through the tunnel junction sensor; the dual tunnel junction sensor including:
    a ferromagnetic electrically conductive first free layer;
    a ferromagnetic electrically conductive first pinned layer;
    a non-magnetic electrically insulating first barrier layer located between the first free layer and the first pinned layer;
    a ferromagnetic electrically conductive second pinned layer;
    an antiferromagnetic electrically conductive pinning layer located between the first and second pinned layers and exchange coupled to the pinned layers so as to pin the pinned layer magnetic moment in each of the pinned layers in a first direction;
    a ferromagnetic electrically conductive second free layer;
    a non-magnetic electrically insulating second barrier layer located between the second free layer and the second pinned layer;
    the first and second free layers each having a magnetic moment
  in a second direction;
  electrically conductive and magnetically isolating first and second isolation layers, the dual tunnel junction sensor being located between the first and second isolation layers;

ferromagnetic electrically conductive first and second shield layers, the dual tunnel junction sensor with first and second isolation layers being located between the first and second shield layers;

a write head including:
  first and second pole piece layers and a write gap layer;
  the first and second pole piece layers being separated by the write gap layer at the ABS and connected at a back gap that is recessed rearwardly in the head from the ABS;
  an insulation stack having at least first and second insulation layers;
  at least one coil layer embedded in the insulation stack; and
  the insulation stack and the at least one coil layer being located between the first and second pole piece layers;

a housing;

a magnetic disk rotatably supported in the housing;

a support mounted in the housing for supporting the magnetic head with its ABS facing the magnetic disk so that the magnetic head is in a transducing relationship with the magnetic disk;

means for rotating the magnetic disk;

positioning means connected to the support for moving the magnetic head to multiple positions with respect to said magnetic disk; and processing means connected to the magnetic head, to the means for rotating the magnetic disk and to the positioning means for exchanging signals with the merged magnetic head, for controlling movement of the magnetic disk and for controlling the position of the magnetic head.

19. The magnetic disk drive as claimed in claim 18 wherein the processing means is connected to the first and second leads for applying the tunneling sense current to the sensor.

20. The magnetic disk drive as claimed in claim 19 wherein the processing means applies said tunneling sense current.

21. The magnetic disk drive as claimed in claim 18 wherein the first and second electrically conductive lead layers are the electrically conductive first and second shield layers.

22. The magnetic disk drive as claimed in claim 18 wherein the antiferromagnetic pinning layer is selected from the group MnFe, NiMn, IrMn, PtMn, CrAlMn and PdMn.

23. The magnetic disk drive as claimed in claim 18 wherein the pinned and free layers are selected from the group CoFe, NiFe and Co.

24. The magnetic disk drive as claimed in claim 18 wherein the first and second barrier layers are made from aluminum oxide.

25. The magnetic disk drive as claimed in claim 18 wherein each ferromagnetic pinned layer is an antiparallel (AP) pinned layer that includes:

a ruthenium (Ru) film spacer layer and first and second ferromagnetic pinned films; and the ruthenium film spacer layer being located between the first and second pinned films so that the second pinned film is antiparallel exchange coupled to the first pinned film.

26. The magnetic disk drive as claimed in claim 25 wherein the first and second pinned film layers are made from cobalt (Co).

27. The magnetic disk drive as claimed in claim 18 wherein the first direction is normal to the ABS.

28. A method of making a dual tunnel junction read head that has an air bearing surface (ABS) comprising the steps of:

forming a electrically conductive, magnetically isolating first isolation layer, forming a ferromagnetic electrically conductive first free layer on the first isolation layer;

forming a non-magnetic electrically insulating first barrier layer on the first free layer;

forming a ferromagnetic electrically conductive first pinned layer on the first barrier layer;

forming an antiferromagnetic pinning layer on the first pinned layer;

forming a ferromagnetic electrically conductive second pinned layer on the pinning layer;

the pinning layer exchange coupled to the first and second pinned layers so as to pin the pinned layer magnetic moment in each of the pinned layers in a first direction;

forming a second barrier layer on the second pinned layer;

forming a ferromagnetic electrically conductive second free layer on the second barrier layer, the first and second free layers each having a magnetic moment in a second direction; and forming an electrically conductive, magnetically isolating second isolation layer on the second free layer.

29. The method as claimed in claim 28 further including:

forming a first shield layer, the first isolation layer being located between the first shield layer and the first free layer; and forming a second shield layer, the second isolation layer being located between the second shield layer and the second free layer.

30. The method as claimed in claim 29 wherein the first and second shields are used as electrical leads.

31. The method as claimed in claim 28 wherein the antiferromagnetic pinning layer is selected from the group MnFe, NiMn, IrMn, PtMn, CrAlMn and PdMn.

32. The method as claimed in claim 28 wherein the pinned and free layers are selected from the group CoFe, NiFe and Co.

33. The method as claimed in claim 28 wherein the first and second barrier layers are made from aluminum oxide.

34. The method as claimed in claim 28 wherein each ferromagnetic pinned layer is an antiparallel (AP) pinned layer that includes:

forming a first pinned film;

forming a ruthenium (Ru) film spacer layer on the first pinned film; and forming a second ferromagnetic pinned film on the ruthenium film spacer layer so that the second pinned film is antiparallel exchange coupled to the first pinned film.

35. The method as claimed in claim 34 wherein the first and second pinned film layers are made from cobalt (Co).

36. The method as claimed in claim 28 wherein the first direction is normal to the ABS.

37. A method of making a dual tunnel junction magnetic head that has an air bearing surface (ABS) comprising:

forming a dual tunnel junction sensor that has a track width as follows:

forming a ferromagnetic electrically conductive first shield layer;

forming an electrically conductive, magnetically isolating first isolation layer on the first shield layer;

forming a ferromagnetic electrically conductive first free layer on the first isolation layer;

forming a non-magnetic electrically insulating first barrier layer on the first free layer;

forming a ferromagnetic electrically conductive first pinned layer on the first barrier layer;

forming an antiferromagnetic pinning layer on the first pinned layer;

forming a ferromagnetic electrically conductive second pinned layer on the antiferromagnetic pinning layer;

the pinning layer exchange coupled to the first and second pinned layers so as to pin the pinned layer magnetic moment in each of the pinned layers in a first direction;

forming a second barrier layer on the second pinned layer;

forming a ferromagnetic electrically conductive second free layer on the second barrier layer, the first and second free layers each having a magnetic moment in a second direction;

forming an electrically conductive, magnetically isolating second isolation layer on the second free layer; and forming a second shield layer on the second isolation layer;

forming a write head as follows:

forming a first pole piece layer;

forming a write gap layer and an insulation stack with a coil layer embedded therein; and forming a second pole piece layer on the insulation stack and the write gap and connected at a back gap to the first pole piece.

38. The method as claimed in claim 37 further including:

providing a tunneling current source for applying a tunneling sense current.

39. The method as claimed in claim 37 wherein the first and second shields are used as electrical leads.

40. The method as claimed in claim 37 wherein the antiferromagnetic pinning layer is selected from the group MnFe, NiMn, IrMn, PtMn, CrAlMn and PdMn.

41. The method as claimed in claim 37 wherein the pinned and free layers are selected from the group CoFe, NiFe and Co.

42. The method as claimed in claim 37 wherein the first and second barrier layers are made from aluminum oxide.

43. The method as claimed in claim 37 wherein each ferromagnetic pinned layer is an antiparallel (AP) pinned layer that includes:

forming a first pinned film;

forming a ruthenium (Ru) film spacer layer on the first pinned film; and forming a second ferromagnetic pinned film on the ruthenium film spacer layer so that the second pinned film is antiparallel exchange coupled to the first pinned film.

44. The method as claimed in claim 43 wherein the first and second pinned film layers are made from cobalt (Co).

45. The method as claimed in claim 37 wherein the first direction is normal to the ABS.

* * * * *